United States Patent
Roberts et al.

[11] Patent Number: 5,985,767
[45] Date of Patent: Nov. 16, 1999

[54] FACET ETCH FOR IMPROVED STEP COVERAGE OF INTEGRATED CIRCUIT CONTACTS

[75] Inventors: Ceredig Roberts; Anand Srinivasan; Gurtej Sandhu; Sujit Sharan, all of Boise, Id.

[73] Assignee: Micron Technology, Inc., Boise, Id.

[21] Appl. No.: 09/228,725

[22] Filed: Jan. 12, 1999

Related U.S. Application Data

[63] Continuation of application No. 08/958,655, Oct. 27, 1997, Pat. No. 5,861,344, which is a continuation of application No. 08/594,842, Jan. 31, 1996, Pat. No. 5,730,835.

[51] Int. Cl.$^6$ .................................................. H01L 21/00
[52] U.S. Cl. ........................ 438/720; 257/773; 438/742
[58] Field of Search ..................................... 438/713, 714, 438/720, 734, 742, 754; 257/748, 750, 761, 773; 216/18, 39, 56

[56] References Cited

U.S. PATENT DOCUMENTS

| | | |
|---|---|---|
| 4,425,183 | 1/1984 | Maheras et al. ......................... 438/754 |
| 4,595,452 | 6/1986 | Landau et al. ............................ 438/713 |
| 4,666,737 | 5/1987 | Gimpelson et al. . |
| 4,792,842 | 12/1988 | Honma et al. . |
| 4,874,719 | 10/1989 | Kurosawa . |
| 4,963,511 | 10/1990 | Smith . |
| 5,066,611 | 11/1991 | Yu . |
| 5,106,779 | 4/1992 | Yu . |
| 5,124,780 | 6/1992 | Sandhu et al. . |
| 5,147,819 | 9/1992 | Yu et al. . |
| 5,166,093 | 11/1992 | Grief . |
| 5,169,491 | 12/1992 | Doan . |
| 5,225,034 | 7/1993 | Yu et al. . |
| 5,278,100 | 1/1994 | Doan et al. . |
| 5,309,023 | 5/1994 | Motonani et al. . |
| 5,346,585 | 9/1994 | Doan et al. ......................... 438/713 X |
| 5,354,490 | 10/1994 | Yu et al. . |
| 5,362,666 | 11/1994 | Dennison . |
| 5,376,405 | 12/1994 | Doan et al. . |
| 5,385,867 | 1/1995 | Ueda et al. . |
| 5,387,550 | 2/1995 | Cheffings et al. . |
| 5,416,048 | 5/1995 | Blalock . |
| 5,420,074 | 5/1995 | Ohshima . |
| 5,444,013 | 8/1995 | Akram et al. . |
| 5,504,038 | 4/1996 | Chien et al. . |
| 5,545,584 | 8/1996 | Wuu et al. . |
| 5,580,821 | 12/1996 | Mathews et al. . |
| 5,644,166 | 7/1997 | Honeycutt et al. ..................... 257/754 |

FOREIGN PATENT DOCUMENTS

| | | |
|---|---|---|
| 0 297 502 A2 | 1/1989 | European Pat. Off. . |
| 0 297 502 A3 | 5/1989 | European Pat. Off. . |
| 0 661 736 A1 | 7/1995 | European Pat. Off. . |
| 0 071 150 | 3/1989 | Japan . |
| 5-152292 | 6/1993 | Japan . |

OTHER PUBLICATIONS

Yoshio Homma: "Plannarization Mechanism of RF–Biased Al Sputtering". Journal of the Electrochemical Society. vol. 140. No. 3. Mar. 1, 1993. pp. 855–860 XP000378165.

"Reliable Tungsten Chemical Vapor Deposition Process with Sputter Etch to Form Contract Studs". 700 IBM Technical Disclosure Bulleting, vol. 30, No. 10, Mar. 1988. pp. 162–163. XP000111112.

"Contact Stud Fabrication Process Using Dual Ion–Bean Deposition and Etch", IBM Technical Disclosure Bulletin, vol. 29, No. 8, Jan. 1987, p. 3403.

*Primary Examiner*—William Powell
*Attorney, Agent, or Firm*—Knobbe, Martens, Olson & Bear, LLP

[57] ABSTRACT

Disclosed is a method for providing improved step coverage of contacts with conductive materials, and particularly metals. A conductive layer is deposited over an insulating layer, either before or after contact opening formation. After both conductive layer deposition and contact formation, a facet etch is performed to slope the conductive layer overlying the contact lip while depositing material from the conductive layer into the lower corner of the contact, where coverage has traditionally been poor. A second conductive layer may then be deposited into the contact to supplement coverage provided by the first conductive layer and the facet etch.

34 Claims, 3 Drawing Sheets

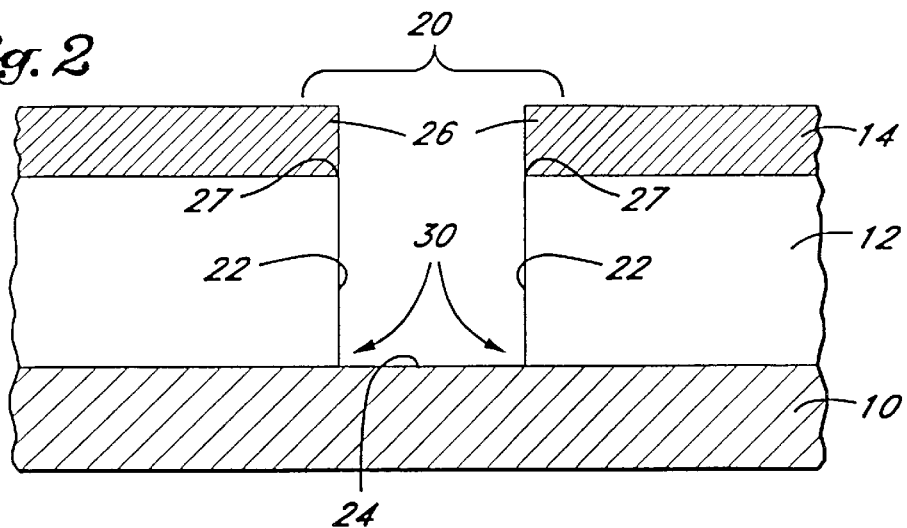
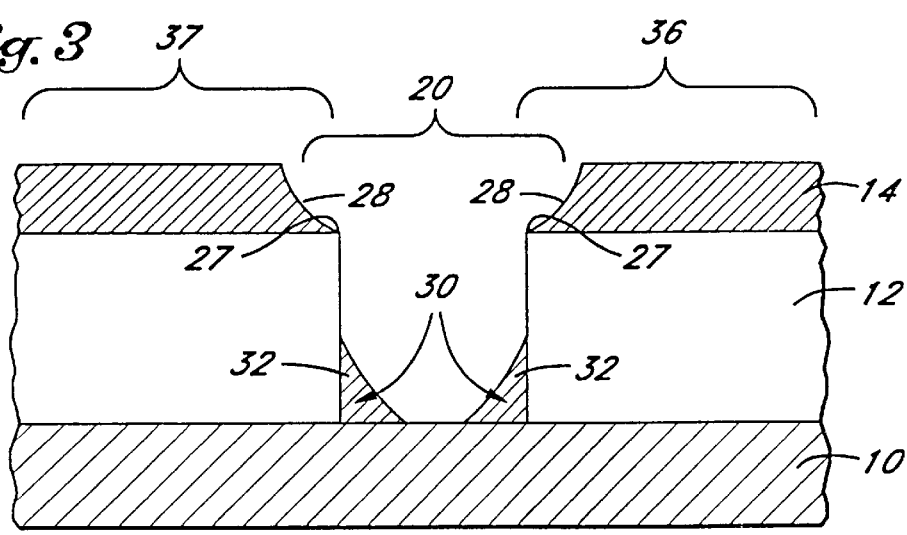
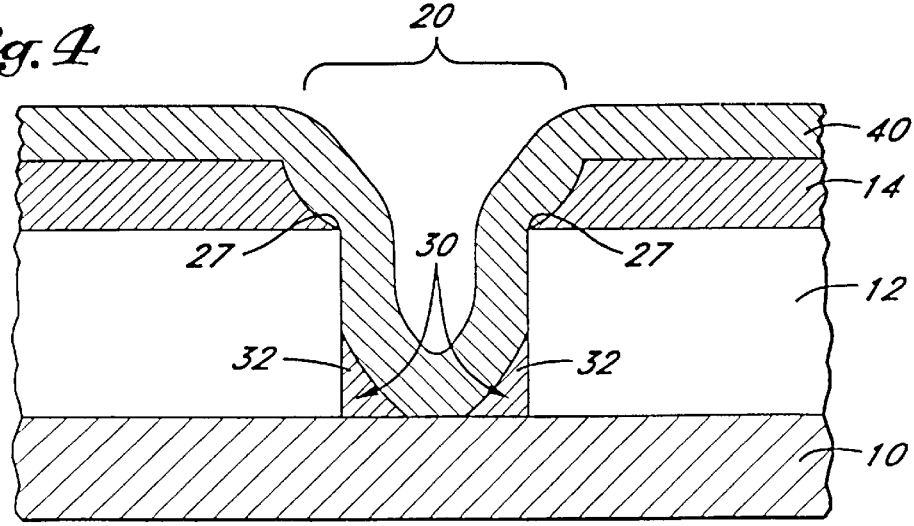

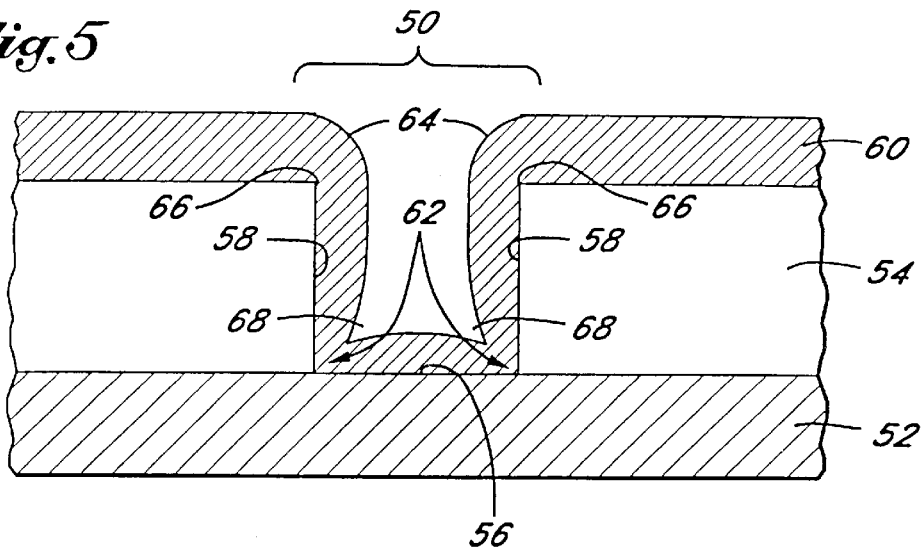
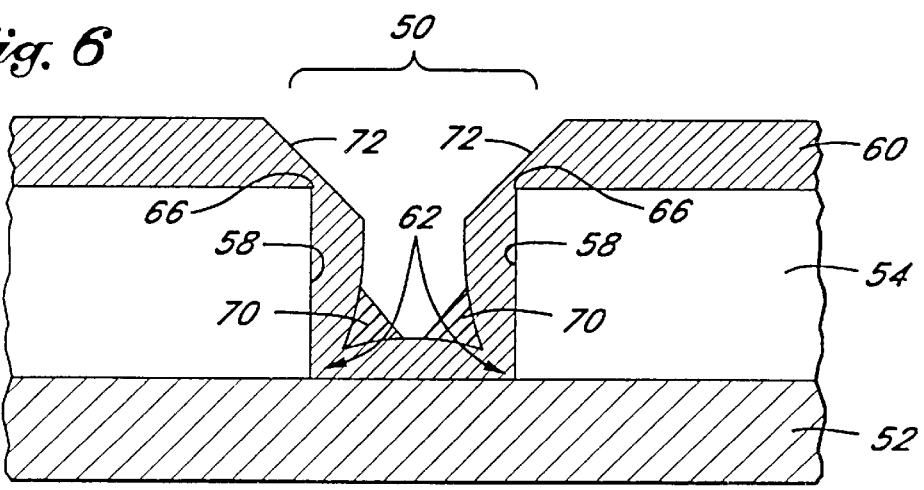
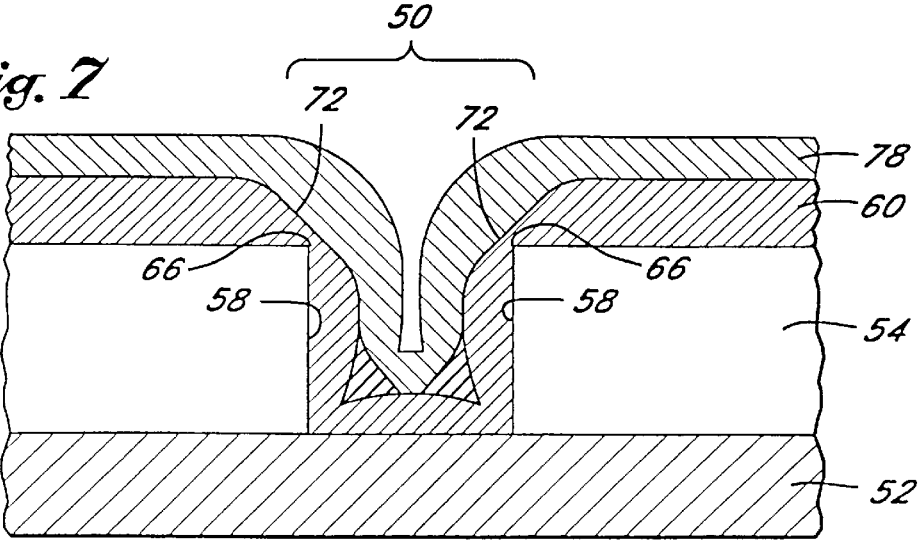

FACET ETCH FOR IMPROVED STEP COVERAGE OF INTEGRATED CIRCUIT CONTACTS

REFERENCE TO RELATED APPLICATION

The present application is a continuation of U.S. patent application Ser. No. 08/958,655, filed Oct. 27, 1997, now U.S. Pat. No. 5,861,344, which is a continuation of U.S. patent application Ser. No. 08/594,842, filed Jan. 31, 1996, issued Mar. 14, 1998 as U.S. Pat. No. 5,730,835.

FIELD OF THE INVENTION

The present invention relates to the deposition of conductive layers into contact vias, and more particularly to improving the step coverage of metals deposited into contacts formed within integrated circuits.

BACKGROUND OF THE INVENTION

Multiple line and device levels in an integrated circuit are typically separated by insulating dielectric layers. Contact opening, more simply referred to as "contacts," are formed through the insulating layers to provide electrical contact between two or more conductive layers. The insulating layers must be grown or deposited to a minimum thickness. Too thin an insulating layer results in an intolerably high interlevel capacitance, which ties up otherwise available conduction carriers. Thus, as dimensions continue to be scaled down to the submicron level, the contact opening shrinks in size but the depth of the contact (through an insulating layer) must remain the same. In other words, the aspect ratio of contact openings increases as circuitry becomes more densely packed.

FIG. 1 illustrates a prior art conductive layer 3 deposited into a contact opening 4 to provide the interlevel electrical contact. It should be understood that FIG. 1 is a schematic cross-sectional view, omitting the backwall for simplicity, but that the contact 4 is ordinarily etched in the shape of a cylinder. Unfortunately, physical vapor deposition of the conductive layer 3, such as metal sputtering and evaporation, produces poor step coverage into narrow contact openings having high aspect ratios. During a metal sputter deposition, for example, metal builds quickly on a lip 5 of the contact 4. A lower corner 6 of the contact 4, in contrast, has very thin metal coverage. This thin layer is subject, during circuit operation, to high resistance and electromigration. Electromigration is the motion of metal ions in response to high density current flow, which can even further thin the metal coverage at a bottom 7 of the contact 4 by piling up the metal ions in some regions while forming voids elsewhere, leading to breakage of the metal layer and open circuits. Adding small amounts of copper (Cu) to aluminum films somewhat diminishes but cannot eliminate the effect of electromigration where poor step coverage produces excessively thin aluminum films.

Quick build-up of sputtered metal on the lip 5 of the contact 4, and the resultant poor step coverage, is produced in part and compounded by a shadow effect at a vertical sidewall 8. The faster deposition of metal on the contact lip 5 creates a bulge into the mouth of the contact 4, sheltering the lower portions and thus even further slowing down deposition in the lower corner 6 of the contact 4. Eventually, the metal may pinch off at the contact mouth before significant metal is deposited in the lower corner 6. Where the contact has an aspect ratio of 1.0 or greater (contact height is equal to or greater than the diameter of the opening) the deposited metal is especially susceptible to pinching off and closing the contact. Voids or "keyholes" are thus created in filling the contact.

One method of improving step coverage involves a process of sloping the sidewall of the contact, thus opening the contact in a tapered or cone shape. The minimum diameter of the bottom of the contact, however, is still limited by photolithographic resolution. Sloping the contact sidewall thus increases the total area occupied by the contact and reduces the allowable packing density. Such decreases in packing density are unacceptable in the face of current commercial requirements for the miniaturization of integrated circuits.

Conductive plugs, which completely fill the contact, have been implemented to eliminate the problem of voids and poor step coverage created by sputter-depositing metals into high aspect-ratio vertical contacts. Chemical vapor deposition (CVD) must generally be used for this process, and tungsten (W) is most often the material used for the plug. Tungsten and the process required for its deposit, however, are expensive compared to conventional sputter-deposited metals.

Tungsten demonstrates higher sheet resistivity than aluminum or other conventional metal interconnects. Thus, tungsten plugs should be used in conduction with lower resistance metal runners, such as alumninum. Separate chambers are required for the metal runner depositions, and for the tungsten plug CVD after contact formation. An adhesion layer is required for efficient deposition into the contact, due to poor adhesion of CVD tungsten to insulating materials in which the contact is formed. On the other hand, poor adhesion may remain in other areas, such as the wafer backside, so that an unwanted tungsten film may delaminate and contaminate the chamber.

In order to use tungsten plugs in conduction with low-resistance metal runners, the tungsten should remain only in the contact, rather than over the entire wafer. If the CVD tungsten is blanket-deposited, a planarizing etchback of the tungtsten is necessary to remove the excess tungsten over the insulating layer prior to aluminum deposition, for example. The etchback requires both a sacrificial layer and an etch process with a 1:1 etch rate ratio for the sacrificial layer and the tungsten. Seeding and selective deposit also requires an etchback step if contacts of different depths are to be filled simulataneously. These requirements make tungsten plugs expensive and difficult to reliably construct. Depositing polysilicon plugs entails similar problems, including high sheet resistivity and the resultant need for additional process steps in providing metal lines over the polysilicon plugs. Additionally, polysilicon plugs often require doping to avoid high contact resistance with underlying doped materials.

It would thus be advantageous to find alternate methods of providing good step coverage into contacts, utilizing conductive materials with lower resistivity, such as aluminum. In this way, conductive runners may be formed simultaneously with the interlevel contact within the opening.

One method of completely filling contacts with aluminum or other metals having low resistance is through bias sputtering. However, the high temperatures associated with this process tend to cause undesirable effects, as is well-known in this art, such as damage to the single-crystal substrate, or formation of large aluminum-copper grains which are difficult to etch. On the other hand, conducting the process at lower temperatures has resulted in excessive electromigration.
}

Much attention has recently been paid to laser planarization of aluminum layers. For example, U.S. Pat. No. 5,032,233, issued to Yu et al., U.S. Pat. No. 5,066,611, issued to Yu, U.S. Pat. No. 5,147,819, issued to Yu et al., and U.S. Pat. No. 5,124,780, issued to Sandhu et al., all disclose improved methods of laser planarization. An aluminum film is irradiated with a pulsed laser, heating the metal to a molten state which may flow and completely fill the contact. The metal layer naturally becomes planarized by this process. An anti-reflective coating, however, is required to efficiently transfer the laser energy to the aluminum, which would otherwise reflect over 80% of the laser energy impinged upon it. Additionally, a very small process window is available in which enough energy is transferred to melt the aluminum without evaporation or other damage to the wafer.

A need thus remains for an efficient method of filling contacts with good step coverage for forming interlevel electrical contact. Advantageously, such a method would also be compatible with conventional sputter deposition techniques, allowing for simultaneous provision of a metallization or interconnect level so as to minimize process steps and cost.

SUMMARY OF THE INVENTION

Disclosed is a method of improving conductive step coverage of a contact in an integrated circuit. A contact opening is formed in an insulating layer, which overlies a partially fabricated integrated circuit, to expose a circuit element. A first conductive layer is deposited over the insulating layer, either before or after formation of the contact. A facet etch is then performed, which sputters material from the first conductive layer, especially at an upper corner over the lip of the contact, into the contact. A sloped facet forms at the upper corner as conductive material is removed therefrom. At least some of this removed conductive material is deposited into the lower corner of the contact, thereby improving conductive coverage of the lower corner.

In accordance with a first preferred embodiment, the first conductive layer is deposited before the contact is opened. The opening would then be etched through both the conductive layer and the insulating layer. The contact opening, defined by an insulating sidewall, would be essentially devoid of conductive material until the facet etch deposits conductive material from the first conductive layer into the lower corner of the contact. A second conductive layer may be deposited after the facet etch to complete conductive coverage of the contact surfaces. In the disclosed first embodiment, the first conductive layer comprises sputter deposited titanium while the second conductive layer comprises a co-sputtered aluminum/copper alloy.

In accordance with a second preferred embodiment, the first conductive layer is deposited after the opening is formed, at least partially lining the contact sidewall and bottom surface. The facet etch is then performed, removing conductive material from a corner of the first conductive layer overlying the contact lip and depositing conductive material into the lower corner of the contact. A second conductive layer may then be deposited over the insulating layer and into the contact, contacting the first conductive layer. Materials used for the two conductive layer may be as described for the first preferred embodiment.

The facet etch thus provides better coverage of the lower corner of the contact and minimizes the risk of shadow effect during the deposition of conductive layers, and especially of sputtered metals.

BRIEF DESCRIPTION OF THE DRAWINGS

FIG. 2 is a shematic, partial sectional view of an integrated circuit having a first conductive layer over an insulating layer, both layers having a contact opening etched therethrough to expose a circuit element in accordance with a processing stage of a first preferred embodiment of the present invention.

FIG. 3 illustrates the result of a facet etch performed on the integrated circuit of FIG. 2.

FIG. 4 illustrates the integrated circuit of FIG. 3 after deposition of a second conductive layer.

FIG. 5 is a schematic, partial sectional view of an integrated circuit having a contact opening etched through an insulating layer to expose a circuit element and a first conductive layer deposited into the contact, in accordance with a processing stage of a second preferred embodiment of the present invention.

FIG. 6 illustrates the integrated circuit of FIG. 5 after a facet etch has been performed.

FIG. 7 illustrates the integrated circuit of FIG. 5 after deposition of a second conductive layer deposited over the first conductive layer and into the contact.

DETAILED DESCRIPTION OF THE PREFERRED EMBODIMENT

Figure 1:
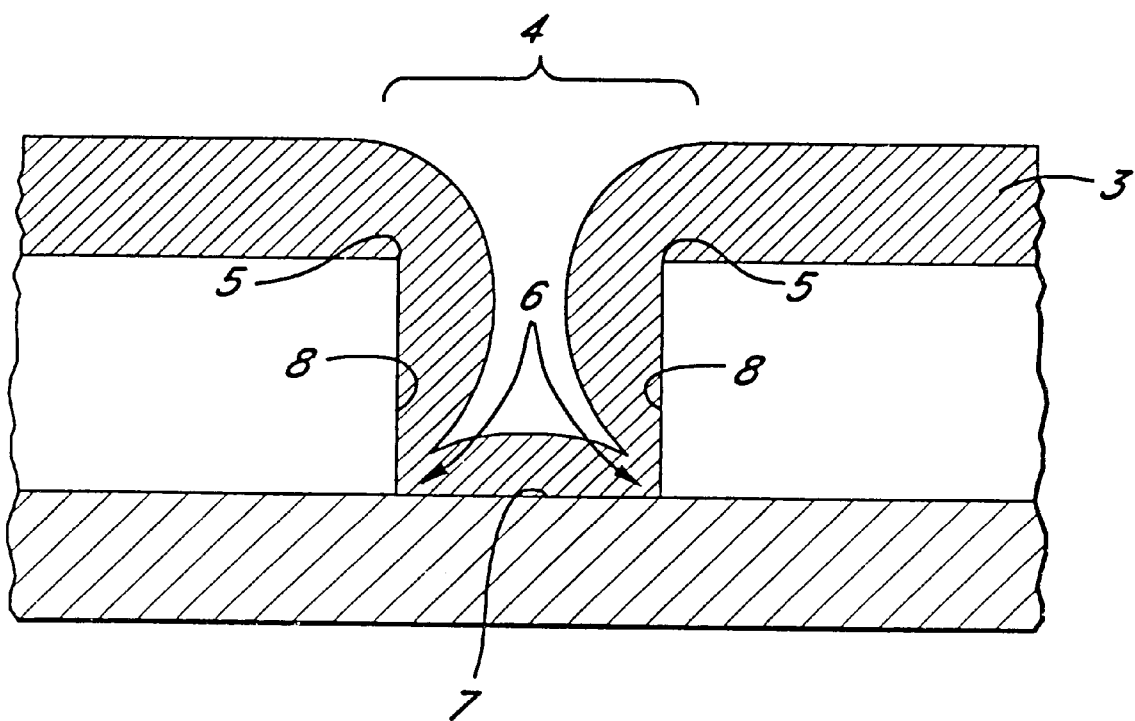
FIG. 1 is a schematic, partial sectional view of a prior art integrated circuit, showing an insulating layer overlying a metal layer, a contact opening etched through the insulating layer, and a metal layer deposited into the contact opening by conventional sputter deposition.

Though the present description of the preferred embodiments focuses on contacts between metal lines, it will be understood by those skilled in the art of integrated circuit fabrication that the invention may be applied to filling contacts between any two levels in an integrated circuit. For example, a contact may be desired between a polysilicon local interconnect to be formed and underlying silicide layers, polysilicon layers, active areas within a silicon substrate, or other circuit elements. Furthermore, the skilled artisan will also find application for the present invention wherever good step coverage is desired for a conformal layer in a contact.

FIG. 2 illustrates a starting point for a first preferred embodiment of the present invention. A circuit element of a partially fabricated integrated circuit will be referred to generally by the reference numeral 10. The underlying portions of the circuit may have been fabricated to this point using conventional processing techniques. The circuit element 10 of the preferred embodiments herein described comprises a metal layer but it may be replaced, in alternative embodiments, by any other circuit element for which electrical connection to an upper layer is desired, as mentioned above. For example, the circuit element 10 may comprise a doped polysilicon plug forming electrical contact to a diffusion area of the silicon substrate. Alternatively, the circuit element 10 may represent the substrate itself, a local interconnect, a capacitor electrode, etc. and may comprise any of a number of conductive materials, such as refractory metal silicide, metal, silicon, metal nitride, and so on.

In the preferred embodiments, however, the circuit element 10 comprises a number of metal sub-layers. Most preferably, the circuit element 10 comprises a titanium (Ti) sub-layer, over which an aluminum/copper (Al/Cu) alloy is formed. The titanium provides good adhesion and ohmic contact to underlying circuitry, while at the same time acting as a barrier against upward diffusion of any underlying silicon. The copper content of the Al/Cu sub-layer may represent only 0.5%–4.0% of the alloy, and is introduced to reduce susceptibility of pure aluminum to electromigration. The underlying Ti sub-layer also serves this function.

An insulating layer 12 overlies the circuit element 10. Preferably, this insulating layer 12 comprises a relatively thick, planarized layer of dielectric material, most preferably an oxide deposited in the form of tetraethylorthosilicate (TEOS), to a thickness of between about 2,000 Å and 30,000 Å, most preferably about 10,000 Å. Planarization may be performed by any of a number of known processes, including chemical mechanical planarization (CMP) and sacrificial-layer etchback, but preferred embodiments herein described incorporate a CMP process.

After planarization, a first conductive layer 14 is deposited by known means. This layer may comprise any conductive material which is compatible with the circuit element 10 and a second conductive layer to be formed. For the first preferred embodiment, where the circuit element 10 includes an Al/Cu alloy, the first conductive layer 14 comprises a layer of titanium having a thickness between about 100 Å and 2,000 Å, most preferably about 1,000 Å. The titanium of the first conductive layer 14 is deposited by a sputtering process known in the art of integrated circuit fabrication.

Once the first conductive layer 14 has been deposited over the insulating layer 12, a contact opening 20 (or simply contact 20) is defined by a standard photolithographic mask step and etched through both the first conductive layer 14 and the insulating layer 12. FIG. 2 illustrates the contact opening 20. Since a sidewall 22 of the contact 20 should be vertical, so that the contact 20 occupies minimal chip area, the etch process or series of processes used to open the contact 20 should be substantially anisotropic. Reactive ion etches, for example, are generally anisotropic. The etch or etches removes material defined by the photoresist mask from the first conductive layer 14 and from the insulating layer 12, opening the contact 20 down to expose the circuit element 10. The sidewall 22 generally conforms to a cylindrical shape closed at a bottom surface 24. Other contact configurations are also viable, such as a rectangular container shape. The contact depth is equal to the thickness of the insulating layer 12, while contact diameter should be consistent with current and future generation packing densities, between about 2,000 Å and 8,000 Å, most preferably about 5,000 Å. The contact aspect ratio for the preferred embodiments may therefore be greater than 1.0, and is most preferably about 2.0. Attempts to conductively line prior art contacts of such high aspect ratios have in general resulted in very poor step coverage, as explained in the "Background" section above.

For the first preferred embodiment, the contact etch must remove Ti of the first conductive layer 14 and clear away oxide of the insulating layer 12, thus exposing the circuit element 10. The exposed portion of the circuit element 10 then forms the bottom surface 24 of the contact 20. The preferred reactive ion etch (RIE) is chemically aided by a plasma containing chlorine and fluorocarbons. $Cl_2$ most preferably aids the Ti etch and $CF_4$ and $CHF_3$ aid the oxide etch, while demonstrating some selectivity against the underlying circuit element 10. Reactor pressure should be maintained between about 10 mTorr and 100 mTorr, most preferably at about 50 mTorr, while the rf power should be between about 200 W and 600 W, most preferably about 400 W. Each etchant gas may be introduced at a flow rate of between about 10 sccm and 100 sccm, depending on the RIE chamber volume. The oxide of the insulating layer 12 is thus etched selectively against the Al/Cu of the underlying circuit element 10, for the present preferred embodiment. A slight overetch is desirable to ensure that all of the oxide is cleared from the contact bottom surface 24.

Alternatively, the first conductive layer 14 may be first etched by a chlorine process which will more efficiently etch the titanium of the first conductive layer 14. The underlying insulating layer 12 may be etched independently by a plasma etch including $CF_4$ and $CHF_3$ as reactive agents. The fluorocarbon plasma etch, described in the previous paragraph, is one example of a process for etching oxide anisotropically.

A facet etch is then performed on the structure to shape an upper corner 26 of the first conductive layer 14 over a lip 27 of the contact 20. (It will be understood that the contact generally conforms to a cylindrical shape and that the upper corner 26 has a circular shape at the top of the cylindrical opening.) Facet etch in general is known in the art, and has been used to slope oxide features within integrated circuits. A facet etch on metal lines is also disclosed in U.S. Pat. No. 5,416,048, issued to Blalock et al., the disclosure of which is hereby incorporated by reference.

The facet etch should be performed by a physical process known as ion beam bombardment, or ion milling. High energy ions of a relatively non-reactive chemical, preferably a noble gas, are accelerated within a chamber and directed toward the wafer. Most preferably, an rf power source creates a plasma condition and argon ions ($Ar^+$) bombard the wafer within an RIE chamber. The etch, commonly known as an argon sputter etch, is enhanced by giving the wafer a negative bias with respect to the plasma. The electric field is naturally stronger at the upper corner 26 of the first conductive layer, attracting the positive argon ions and leading to preferential etch. A sloped facet 28 results over the contact lip 27, as illustrated in FIG. 3.

Preferred parameters for the argon sputter etch include an rf power between about 300 and 1,000 W, most preferably about 800 W, a pressure between about 5 and 40 mTorr, most preferably about 15 mTorr, and an argon flow between about 10 and 100 sccm, most preferably about 50 sccm.

As illustrated in FIG. 3, the material removed from the upper corner 26 (FIG. 2) of the first conductive layer 14 also acts as a sputter deposition target, so that at least some of the conductive material of the upper corner 26 (FIG. 2) is deposited into a lower corner 30 of the contact 20 to form a conductive corner fill 32 (FIG. 3). FIGS. 2 and 3 show a cross-sectional view of the contact 20, wherein the backwall is omitted from the views for simplicity. Material sputtered from the upper corner 26 on a right side 36 of the contact 20 is deposited in the lower corner 30 on a left side 37. Conversely, material sputtered from the upper corner 26 on the left side 37 is deposited in the lower corner on the right side 36. Similarly, material from every point of the upper corner 26 all around the mouth of the contact 20 are sputtered to a point diagonally opposite in the lower corner 30, forming an annulus (doughnut shape) of conductive material which has been referred to as the corner fill 32 of the present invention.

For the preferred embodiments, elemental titanium is etched from the upper corner 26 of the first conductive layer 14, and the titanium is sputtered to the lower corner 30 of the contact where the bottom surface 24 and sidewall 22 meet. Thus, the corner fill 32 provides conductive (Ti) coverage of the lower corner 30, tapering upwardly along the sidewall 22 and tapering inwardly along the bottom surface 24. This coverage occurs precisely where a contact fill by conventional sputter deposition would produce the thinnest metal coverage, as can be seen from the prior art of FIG. 1.

A second conductive layer 40 (FIG. 4) is next deposited into the contact 20. Preferably, the second conductive layer 40 is comprised of a metal suitable for longrange interconnection, and most preferably it comprises an aluminum alloy. For example, the second conductive layer 40 may comprise a composite titanium and Al/Cu alloy, just as the circuit element 10 of the preferred embodiments. A thin titanium layer may be deposited prior to the Al/Cu alloy to serve as an adhesion layer, since upper portions of the sidewall 22 (oxide in the preferred embodiments) may remain bare after the facet etch. The second conductive layer 40 should be deposited by sputter (e.g., Ti) and/or co-sputter (e.g., Al/Cu), as the case may be, to a thickness of between about 1,000 Å and 10,000 Å, most preferably about 5,000 Å. Metal tends to build on the contact sidewall 22 at only about 10–15% of the rate on horizontal surfaces, such that the contact 20 (about 5,000 Å across and 10,000 Å deep) is not completely filled.

It can be seen, from a comparison of FIG. 1 with FIG. 4, that the corner fill 32 improves metal step coverage of the contact 20. In the first place, it effectively lowers the aspect ratio of the contact 20 by raising the average level of the contact bottom surface 24 closer to the contact lip 27. Although metal still builds more quickly at the lip 27, the shadow effect seen in FIG. 1 is delayed since the lower portions of the sidewall 22 are sloped inward. Secondly, the deficiencies in step coverage produced by conventional sputter deposition (particularly at the lower corner 6 seen in FIG. 1) are compensated by the underlying corner fill 32 (FIG. 4).

FIGS. 5–7 illustrate generally a method for improving step coverage of a contact, in accordance with a second preferred embodiment of the present invention. As with the first preferred embodiment, described above, the method relies upon a facet etch for filling a lower corner of the contact.

FIG. 5 illustrates an integrated circuit after a contact opening 50 has been formed therein. A circuit element 52, which may be identical to that described with respect to the first preferred embodiment, has been provided over a partially fabricated integrated circuit, as has an insulating layer 54. The insulating layer 54 may also be identical to that described above, and may be similarly planarized.

Unlike the first embodiment, however, the contact opening 50 is etched through the insulating layer 54 alone. Nevertheless, the $C_2F_6$ plasma etch described above may also serve to form the contact opening 50 of the second preferred embodiment. It will be understood that other anisotropic processes for etching the insulating layer 54 are known in this art and would be equally applicable. As with the embodiment first described above, the oxide of the insulating layer 54 should preferably be etched selectively against the underlying circuit element 52 (Al/Cu in the preferred embodiments) and a slight overetch performed to ensure that all of the oxide is cleared from a bottom surface 56 of the contact 50. The anisotropic etch produces a vertical contact sidewall 58, preferably in a cylindrical shape.

A first conductive layer 60 is next deposited into the contact 50 using a known deposition technique, most preferably by a metal sputter process. FIG. 5 illustrates the product of this step. It can be seen that FIG. 5 resembles the prior art contact fill of FIG. 1, the metal sputter producing poor step coverage into the contact 50: thin metal coverage of a lower corner 62 of the contact and a thicker metal at an upper corner 64 over a contact lip 66. The first conductive layer 60, need not supply all of the metal required for good contact and so may be deposited as a thinner layer than the metal layer 3 of FIG. 1. Preferably, the first conductive layer 60 comprises titanium deposited to a thickness between about 500 Å and 2,000 Å, and most preferably about 1,000 Å, similar to the composition and thickness of the first conductive layer 14 of the first preferred embodiment (FIG. 2).

In contrast to the first embodiment, however, the first conductive layer 60 of the second preferred embodiment does provide some coverage of the bottom surface 56 and sidewall 58 of the contact 50. If deposited by sputter deposition, as shown, the shadow effect during deposition leaves a recess 68 adjacent the thin first conductive layer 60 within the lower corner 62. This recess 68 is shadowed by the thick upper corner 64, making it difficult to reach by conventional deposition techniques.

After the first conductive layer 60 has been formed, a facet etch is performed on the wafer. Most preferably, the facet etch comprises an ion beam milling process having the same parameters described above. As with the first preferred embodiment, the facet etch removes conductive material (titanium in the preferred embodiments) from the upper corner 64 over the contact lip 66 and deposits this material into the lower corner 62 of the contact 60. FIG. 6 illustrates an annular corner fill 70 in the recess 68 (FIG. 5) which was left in lower corner 62 after the titanium sputter deposition. A sloped facet 72 rings the mouth of the contact 20, over the contact lip 66.

A second conductive layer 78 (FIG. 7) then supplements the metal coverage provided by the first conductive layer and facet etch. This supplement is especially advisable over the facet 72, at which point the facet etch may have excessively thinned the first conductive layer 60, perhaps even to the point of exposing the contact lip 66 (formed of the insulating layer 54). The remainder of the contact 20, including the sidewall 58 and bottom surface 56 and especially the lower corner 62, is fairly well covered by the first conductive layer 60, which comprises titanium for the preferred embodiment. Thus, no adhesion layer is required as part of the second conductive layer 78, and the metal may be deposited to a lesser thickness than that of the first preferred embodiment.

Most preferably, the second conductive layer 78 comprises an aluminum/copper alloy deposited to a thickness of between about 2,000 Å and 10,000 Å, most preferably about 5,000 Å. The contact 50 should not be completely filled after the first conductive layer deposition, facet etch, and second conductive layer deposition, in order to avoid the possibility of forming a void within the contact.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

We claim:

1. A method of forming a contact opening lined with a conductive material, the method comprising the steps of:

forming an insulating layer over a partially fabricated integrated circuit;

forming a contact opening through the insulating layer, the contact opening exposing an underlying circuit element;

depositing a first conductive layer over the insulating layer; and forming a facet over a lip of the contact opening.

2. The method of claim 1, wherein forming the facet comprises a facet etch.

3. The method of claim 2, wherein the facet etch deposits conductive material from the conductive layer into the contact opening.

4. The method of claim 3, wherein the facet etch deposits conductive material into a lower corner of the contact opening.

5. The method of claim 1, wherein depositing the first conductive layer is performed prior to forming the contact opening, and further comprising depositing a second conductive layer over the first conductive layer and into the contact opening.

6. The method of claim 5, wherein the insulating layer has a depth between about 2,000 and method of claim 30,000 Å, the contact opening has a diameter between about 2,000 and 8,000 Å, and the second conductive layer has a thickness between about 1,000 and 10,000 Å.

7. The method of claim 5, wherein forming the contact opening comprises performing a plasma etch through both the first conductive layer and the insulating layer.

8. The method of claim 5, wherein forming the contact opening comprises a chlorine etch of the first conductive layer and a fluorocarbon plasma etch of the insulating layer.

9. The method of claim 1, wherein depositing the first conductive layer is performed after forming the contact opening, and the first conductive layer lines the contact opening.

10. The method of claim 9, wherein the insulating layer has a depth between about 2,000 and 30,000 Å, the contact opening has a diameter between about 2,000 Å and 8,000 Å, and the first conductive layer has a thickness between about 500 Å and 2,000 Å.

11. The method of claim 9, wherein forming the contact opening comprises etching through the insulating layer and stopping the etch on the underlying circuit element.

12. The method of claim 9, further comprising depositing a second conductive layer into the contact opening after the facet etch.

13. The method of claim 1, wherein depositing the first conductive layer comprises a metal sputter deposition.

14. The method of claim 13, wherein the first conductive layer comprises a titanium layer.

15. The method of claim 14, further comprising depositing a second conductive layer.

16. The method of claim 15, wherein the second conductive layer comprises an aluminum layer.

17. The method of claim 16, wherein the second conductive layer further comprises between about 0.5 and 4.0% copper.

18. The method of claim 2, wherein the facet etch comprises a substantially non-reactive, physical etch.

19. The method of claim 18, wherein the facet etch comprises ion milling.

20. The method of claim 19, wherein the ion milling comprises bombarding a wafer surface with a plurality of noble gas ions.

21. The method of claim 20, wherein the ion milling comprises an argon sputter etch.

22. The method of claim 21, wherein the argon sputter etch comprises maintaining an rf power between about 300 and 1,000 W, a pressure between about 5 mTorr and 40 mTorr and an argon flow between about 10 sccm and 100 sccm.

23. A method of forming an interconnect layer in an integrated circuit while forming contact to an underlying circuit element, the method comprising:

etching a contact via through an interlevel insulating layer to expose the circuit element, the contact via having a lip surrounding an upper boundary and a lower corner surrounding a lower boundary;

depositing a first conductive material to form a first conductive layer over the insulating layer;

performing a facet etch preferentially etching the first conductive material from a corner of the first conductive layer over the contact via lip, and sputtering the etched material into the lower corner;

depositing a second conductive material to form a second conductive layer over the insulating layer and into the contact via after the facet etch.

24. The method of claim 23, wherein depositing the first conductive material comprises depositing the material into the contact to a thickness less than half the thickness of a diameter of the contact via, the first conductive layer forming electrical contact with the exposed circuit element; and depositing the second conductive material comprises depositing the second conductive layer over and directly contacting the first conductive layer.

25. The method of claim 24, wherein the second conductive material is deposited conformally over the first conductive layer to a thickness insufficient to completely fill the contact via.

26. The method of claim 23, wherein depositing the first conductive material is performed prior to etching the contact via.

27. A method of at least partially filling a contact via through an insulating layer, the method comprising:

depositing a first conductive layer over the insulating layer and into the contact via;

performing a facet etch on the conductive layer; and depositing a second conductive layer over the insulating layer and over and directly contacting the first conductive layer in the contact via.

28. The method of claim 27, wherein the first and second conductive layer depositions comprise metal sputter depositions.

29. A method of providing metal coverage on a sidewall and a bottom surface of an opening in an insulating layer, the method comprising:

sputtering a metal layer over the insulating layer;

forming a conductive annular corner fill over the bottom surface and proximate the sidewall; and depositing a supplemental metal later over the annular corner fill, the sidewall and the bottom surface.

30. The method of claim 29, wherein the opening has a diameter of less than about 8,000 Å.

31. The method of claim 28, wherein the opening has an aspect ratio of greater than about 1.0.

32. An integrated circuit having a contact between a circuit element and an interconnect level, the integrated circuit comprising:

an insulating layer over and directly contacting the circuit element, the insulating layer having a via therethrough and a top surface, via defined by a sidewall and a bottom surface, the via sidewall and the insulating layer top surface meeting at a via lip;

a first metal layer over and directly contacting the insulating layer top surface and lining the via sidewall, the first metal layer comprising an annular corner fill over the via bottom surface and proximate the sidewall; and a second metal layer over and directly contacting the first metal layer and lining the via sidewall and bottom surface.

33. The integrated circuit of claim 32, wherein the first metal layer has a sloped facet over the via lip.

34. The integrated circuit of claim 32, wherein the first metal layer lines the via sidewall and bottom surface, electrically contacting the circuit element at the via bottom surface.

\* \* \* \* \*

UNITED STATES PATENT AND TRADEMARK OFFICE
CERTIFICATE OF CORRECTION

PATENT NO. : 5,985,767

DATED : November 16, 1999

INVENTOR(S) : Ceredig Roberts, Anand Srinivasan, Gurtej Sandhu and Sujit Sharan

It is certified that error appears in the above-identified patent and that said Letters Patent is hereby corrected as shown below:

At column 6, line 44 replace "comer" with --corner--
At column 6, line 46 replace "comer" with --corner--
At column 6, line 47 replace "comer" with --corner--
At column 6, line 48 replace "comer" with --corner--
At column 6, line 51 replace "comer" with --corner--
At column 6, line 53 replace "comer" with --corner--
At column 6, line 56 replace "comer" with --corner--
At column 6, line 62 replace "comer" with --corner--
At column 6, line 63 replace "comer" with --corner--
At column 9, line 18 replace "and method of claim 30,000 Å" with --and 30,000 Å--
At column 9, line 67 replace "and 100 sccm." with --and 100 sccm.--
At column 10, line 7 replace "lower comer" with --lower corner--
At column 10, line 12 replace "from a comer" with --from a corner--
At column 10, line 14 replace "lower comer" with --lower corner--
At column 10, line 52 replace "comer fill" with --corner fill--
At column 10, line 55 replace "comer fill" with --corner fill--

Signed and Sealed this

Twenty-seventh Day of March, 2001

Attest:

NICHOLAS P. GODICI

Attesting Officer

Acting Director of the United States Patent and Trademark Office